(12) United States Patent
Ahn

(10) Patent No.: US 8,963,598 B2
(45) Date of Patent: Feb. 24, 2015

(54) DUTY RATE DETECTER AND SEMICONDUCTOR DEVICE USING THE SAME

(71) Applicant: SK Hynix Inc., Gyeonggi-do (KR)

(72) Inventor: Sung-Ho Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/090,795

(22) Filed: Nov. 26, 2013

(65) Prior Publication Data

US 2014/0368245 A1 Dec. 18, 2014

(30) Foreign Application Priority Data

Jun. 18, 2013 (KR) .................. 10-2013-0069716

(51) Int. Cl.
 *H03K 3/017* (2006.01)
(52) U.S. Cl.
 CPC ..................................... *H03K 3/017* (2013.01)
 USPC ......................................................... 327/175

(58) Field of Classification Search
 USPC .......................................................... 327/175
 See application file for complete search history.

(56) References Cited

U.S. PATENT DOCUMENTS

2012/0154006 A1* 6/2012 Ahn et al. ..................... 327/175

FOREIGN PATENT DOCUMENTS

KR 1020090045592 5/2009
KR 1020120068318 6/2012

* cited by examiner

*Primary Examiner* — Daniel Rojas
(74) *Attorney, Agent, or Firm* — IP & T Group LLP

(57) ABSTRACT

A duty rate detection circuit includes a duty rate detection block suitable for outputting a duty rate detection signal by detecting a duty rate of a clock signal having a first logic duration and a second logic duration and an output control block suitable for comparing the number of the first logic duration and the number of the second logic duration for a detection period and controlling an output moment of the duty rate detection signal.

14 Claims, 6 Drawing Sheets

DUTY RATE DETECTER AND SEMICONDUCTOR DEVICE USING THE SAME

CROSS-REFERENCE TO RELATED APPLICATIONS

The present application claims priority of Korean Patent Application No. 10-2013-0069716, filed on Jun. 18, 2013, which is incorporated herein by reference in its entirety.

BACKGROUND

1. Field

Exemplary embodiments of the present invention relate to semiconductor device, and more particularly, to a duty rate detection circuit and a semiconductor device using the same.

2. Description of the Related Art

Semiconductor devices including a Double Data Rate Synchronous Dynamic Random Access Memory (DDR SDRAM) receive various signals from an external controller and perform diverse operations. Among the signals received from the external controller is a clock signal. A semiconductor device uses the clock signal as a source and generates an internal clock signal based on the clock signal. Since the semiconductor device performs an operation based on the internal clock signal, the frequency of the internal clock signal becomes the operation frequency of the semiconductor device. Therefore, the operation rate of the semiconductor device may be increased only by increasing the frequency of the internal clock signal. However, since there is limitation in raising the frequency of the internal clock signal, many methods for increasing the operation rate of a semiconductor device with a fixed frequency have been suggested. Among the methods is a method of increasing the applicability of a clock signal.

Conventional Single Data Rate (SDR) scheme is a method of outputting a data to a rising edge of a clock signal, and conventional Double Data Rate (DDR) scheme is a method of outputting a data to a rising edge and a falling edge of a clock signal. In other words, according to the DDR scheme, two data are outputted in one cycle of a clock signal. Therefore, when a semiconductor device with the DDR scheme and a semiconductor device with the SDR scheme receive clock signals of the same frequency, the semiconductor device with the DDR scheme may process twice as much data as the semiconductor device of the SDR scheme does. This signifies that the operation rate of the semiconductor device with the DDR scheme is twice as fast as that of the semiconductor device with the SDR scheme.

Meanwhile, since the DDR scheme uses the rising edge and falling edge of a clock signal, it is important to maintain the duty rate of the clock signal at 50:50. In other words, the logic high duration and the logic low duration of the clock signal have to be the same. If the duty rate of the clock signal goes out of 50:50 due to jitter and/or other reasons, data outputted in response to the clock signal may not be reliable. Thus, a circuit for controlling the duty rate of the clock signal is needed, and the circuit is called a duty rate correction circuit.

Meanwhile, the operation rate of semiconductor devices is getting faster and faster to satisfy users' demand. Faster operation rate means increasing frequency of the clock signal, which also means that it becomes more difficult to control the duty rate of the clock signal. Therefore, the industry and researchers are trying to delicately design the duty rate correction circuit.

FIG. 1 is a block diagram illustrating a conventional duty rate correction circuit.

Referring to FIG. 1, the duty rate correction circuit includes a duty rate correction block 110, a clock dividing block 120, a duty rate detection block 130 and a duty rate control block 140.

The duty rate correction block 110 is fed back with a duty control signal CTR, corrects the duty rate of an input clock signal CLK_IN and outputs a clock signal CLK_OUT with a corrected duty rate. The corrected clock signal CLK_OUT which is outputted from the duty rate correction block 110, has almost the same duty rate as that of the input clock signal CLK_IN that may not have a duty rate of 50:50 before a duty rate correction operation is performed, and, after the duty rate correction operation is performed, the corrected clock signal CLK_OUT has a duty rate of 50:50.

The clock dividing block divides the corrected clock signal CLK_OUT into a rising clock signal RCLK that corresponds to a rising edge and a falling dock signal FCLK that corresponds to a falling edge. The rising clock signal RCLK represents a logic high duration of the corrected clock signal CLK_OUT, and the falling clock signal FCLK represents a logic low duration of the corrected clock signal CLK_OUT. This will be described again later with reference to FIG. 3.

The duty rate detection block 130 detects a duty rate of the rising clock signal RCLK and the falling clock signal FCLK, which is the duty rate of the corrected clock signal CLK_OUT and generates a duty rate detection signal DET. The duty rate detection signal DET has a logic level value corresponding to the duty rate of the corrected clock signal CLK_OUT. For example, when the logic high duration of the corrected clock signal CLK_OUT is longer than the logic low duration, the duty rate detection signal DET may have a logic high value. When the logic low duration of the corrected clock signal CLK_OUT is longer than the logic high duration, the duty rate detection signal DET may have a logic low value.

The duty rate control block 140 generates the control signal CTR for controlling the duty rate of the input clock signal CLK_IN in response to the duty rate detection signal DET. The control signal CTR is fed back into the duty rate correction block 110, which controls the logic high duration or logic low duration of the input clock signal CLK_IN based on the control signal CTR and outputs the corrected clock signal CLK_OUT. The corrected dock signal CLK_OUT, which is generated through the above-described duty rate correction operation, has a duty rate of 50:50.

FIG. 2 is a circuit diagram illustrating the duty rate detection block 130 shown in FIG. 1.

Referring to FIG. 2, the duty rate detection block 130 includes a sense amplifier 210.

The sense amplifier 210 may include a cross-couple-type sense amplification circuit, and it receives the rising clock signal RCLK and the falling clock signal FCLK to generate a first output signal OUT1 and a second output signal OUT2. The sense amplifier 210 receives a strobe signal STB, and it controls starts of a charge operation and a discharge operation in response to the strobe signal STB. Although not illustrated in the drawing, the duty rate detection signal DET shown in FIG. 1 is generated in response to the first output signal OUT1 and the second output signal OUT2

FIG. 3 is a timing diagram illustrating operation of the sense amplifier 210 shown in FIG. 2. For clear description, it is assumed that the clock signal CLK_OUT is not fully corrected yet, and thus the logic high duration of the clock signal CLK_OUT is currently longer than the logic low duration. In short, the logic high duration of the rising clock signal RCLK is longer than the logic high duration of the falling clock signal FCLK.

Hereafter, the operation of the duty rate detection block 130 shown in FIG. 1 is described with reference to FIGS. 2 and 3.

The strobe signal STB is enabled and before a duty rate correction operation output are the first output signal OUT1 and the second output signal OUT2, which are pre-charged with a predetermined voltage through a charge operation. When the strobe signal STB is disabled, the first output signal OUT1 is gradually discharged while still in the logic high duration of the rising clock signal RCLK, and the second output signal OUT2 is gradually discharged while still in the logic high duration of the falling clock signal FCLK. After the discharge of the first output signal OUT1 and the second output signal OUT2 to some extent, when the difference between the voltage level of the first output signal OUT1 and the voltage level of the second output signal OUT2 becomes greater than a predetermined value, the first output signal OUT1 and the second output signal OUT2 are amplified to predetermined voltage levels, respectively. Since the logic high duration of the rising clock signal RCLK is longer than the logic high duration of the falling clock signal FCLK in this example, the first output signal OUT1 is pull-down amplified and the second output signal OUT2 is pull-up amplified.

The duty rate detection block 130 has the following drawbacks.

As shown in FIG. 3, after the discharge of the first output signal OUT1 and the second output signal OUT2 to some extent, when the voltage level difference between the first output signal OUT1 and the second output signal OUT2 becomes greater than the predetermined value, the first output signal OUT1 and the second output signal OUT2 are respectively amplified to the predetermined voltage levels. In this process, the numbers of the discharges of the first output signal OUT1 and of the second output signal OUT2 may be different. In other words, the first output signal OUT1 may be discharged seven times while the second output signal OUT2 may be discharged six times. After all, the amplification operation may be affected by the difference in the numbers of the discharges of the first output signal OUT1 and of the second output signal OUT2. This means that the first output signal OUT1 and the second output signal OUT2 are not reliably compared, and thus means that the duty rate of the corrected clock signal CLK_OUT may not be accurately detected.

SUMMARY

Various embodiments of the present invention are directed to a duty rate detection circuit that may accurately detect the duty rate of a clock signal and a semiconductor device using the same.

In accordance with an embodiment of the present invention, a duty rate detection circuit may include a duty rate detection block suitable for outputting a duty rate detection signal by detecting a duty rate of a clock signal having a first logic duration and a second logic duration and an output control block suitable for comparing the number of the first logic duration and the number of the second logic duration for a detection period and controlling an output moment of the duty rate detection signal.

In accordance with another embodiment of the present invention, a semiconductor device may include a duty rate discharge unit suitable for performing a discharge operation in a first output terminal and a second output terminal during a first logic duration and a second logic duration of a clock signal, respectively, a level detection unit suitable for detecting voltage levels of the first output terminal and the second output terminal discharged to a predetermined target voltage level, an output unit suitable for detecting a duty rate of the clock signal at a moment when the number of the first logic duration and the number of the second logic duration representing the discharge operation time become the same after an output signal of the level detection unit is enabled and a locking information generation unit suitable for generating duty locking information by comparing the output signal of the level detection unit with an output signal of the output unit.

In accordance with an embodiment of the present invention, a duty rate detection circuit may include a duty rate discharge unit suitable for respectively discharging a first terminal therein and a second terminal therein having corresponding predetermined voltage levels for corresponding duration between a first logic duration and a second logic duration of a clock signal, an output control unit suitable for generating a discharge detection signal synchronized with the first logic duration when one of the first terminal and the second terminal is discharged to a reference voltage level and an output unit suitable for detecting in response to the discharge detection signal synchronized with the first logic duration a duty rate of the clock signal based on the clock signal having toggled until the discharge detection signal is synchronized with the first logic duration, wherein, the duty rate discharge unit begin discharging in synchronized with the first logic duration.

The duty rate detection circuit in accordance with the embodiments of the present invention may generate an accurate detection signal with the same number of discharges in the logic high duration and logic low duration of a clock signal.

DETAILED DESCRIPTION

Figure 1:
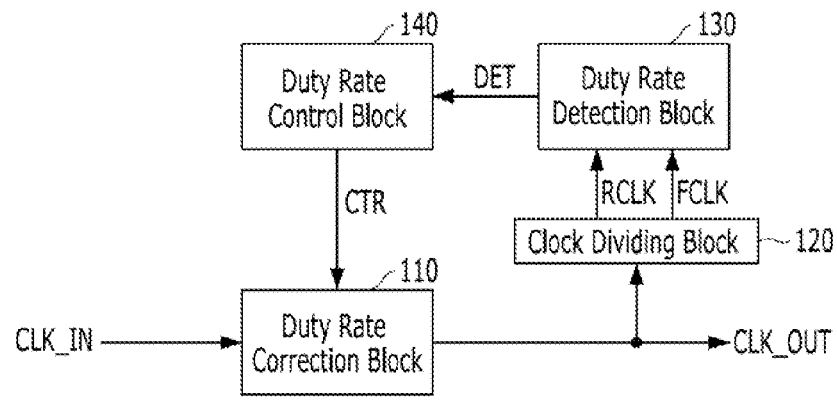
FIG. 1 is a block diagram illustrating a conventional duty rate correction circuit.
Figure 2:
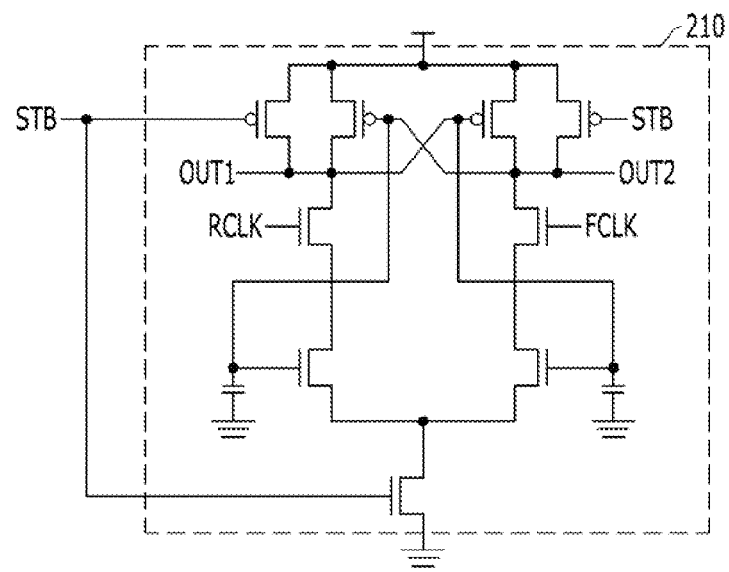
FIG. 2 is a circuit diagram illustrating a duty rate detection block shown in FIG. 1.
Figure 3:
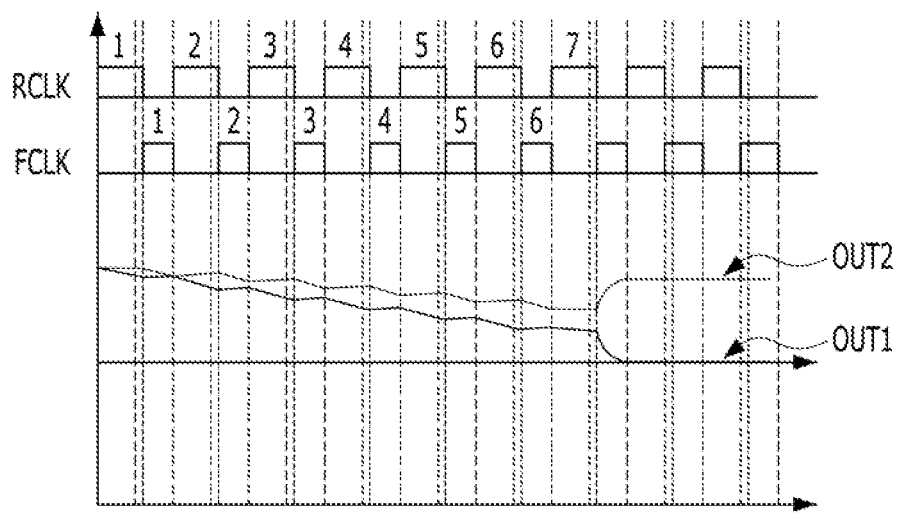
FIG. 3 is a timing diagram illustrating operation of a sense amplifier shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention.

Herein, it will be understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 4:
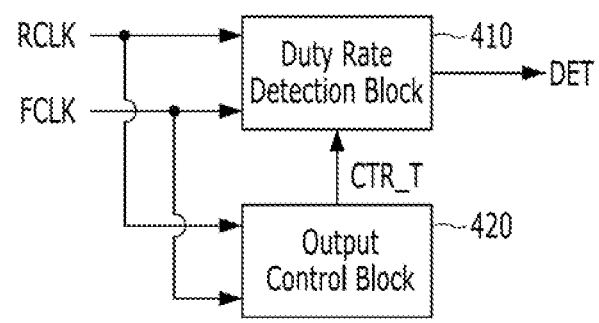
FIG. 4 is a block diagram illustrating a duty rate detection circuit in accordance with an embodiment of the present invention.

FIG. 4 is a block diagram illustrating a duty rate detection circuit in accordance with an embodiment of the present invention.

Referring to FIG. 4, the duty rate detection circuit includes a duty rate detection block 410 and an output control block 420.

The duty rate detection block 410 may receive a rising clock signal RCLK and a falling clock signal FCLK and generate a duty rate detection signal DET. The output control block 420 may compare the number of logic high durations of the rising clock signal RCLK with the number of logic high durations of the falling clock signal FCLK and control a time when the duty rate detection signal DET is output from the duty rate detection block 410. Herein, the rising clock signal RCLK and the falling clock signal FCLK may represent the logic high duration and logic low duration of a corrected clock signal CLK_OUT as described with reference to FIG. 1, respectively. The output control block 420 may receive the rising clock signal RCLK and the falling clock signal FCLK and generate a time control signal CTR_T. The duty rate detection block 410 outputs the duty rate detection signal DET in response to the time control signal CTR_T. This will be described again later.

The duty rate detection circuit in accordance with the embodiment of the present invention may control the number of logic high durations of the corrected dock signal CLK_OUT and the number of logic low durations of the corrected clock signal CLK_OUT so that the numbers of the logic high and logic low durations respectively representing discharge time of the first and second output signals OUT1 and OUT2 may be the same.

Figure 5:
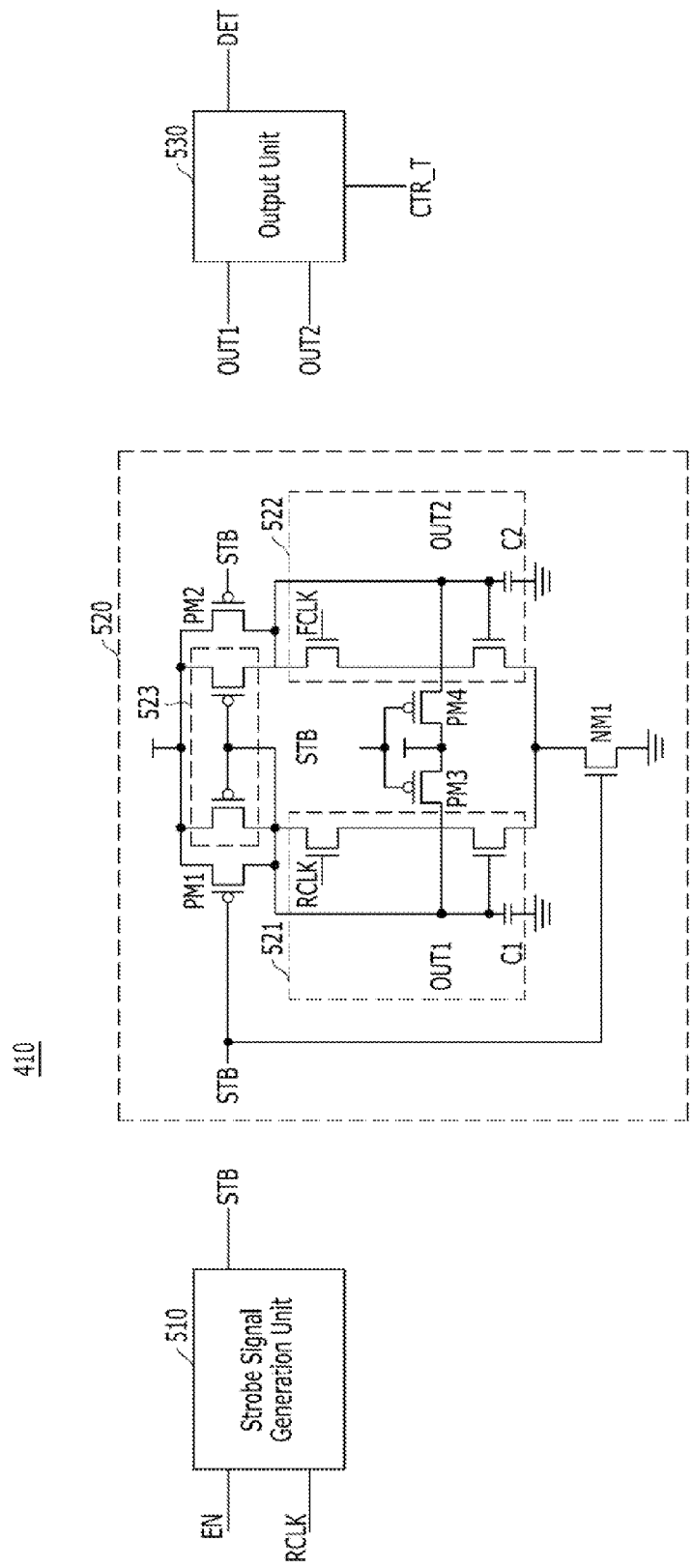
FIG. 5 is a block diagram illustrating a duty rate detection block of the duty rate detection circuit shown in FIG. 4.

FIG. 5 is a block diagram illustrating a duty rate detection block of the duty rate detection circuit shown in FIG. 4

Referring to FIG. 5, the duty rate detection block 410 may include a strobe signal generation unit 510, a duty rate discharge unit 520, and an output unit 530.

The strobe signal generation unit 510 may synchronize an enable signal EN with the rising clock signal RCLK and output the strobe signal STB. The strobe signal generation unit 510 may be formed of a flip-flop circuit. Herein, the enable signal EN controls the discharge operation and charge operation of the duty rate discharge unit 520. The duty rate discharge unit 520 may perform the discharge operation in response to the rising clock signal RCLK in response to the strobe signal STB synchronized with the rising clock signal RCLK.

The duty rate discharge unit 520 may perform the discharge operation in response to each of the rising clock signal RCLK and the falling clock signal FCLK. The duty rate discharge unit 520 may be designed as a current mirror type, and it may include a first discharger 521, a second discharger 522, a loader 523, chargers PM1 and PM2, equalizers PM3 and PM4, and an enabler NM1.

The first discharger 521 may discharge an output terminal, through which the first output signal OUT1 may be output, in response to the rising clock signal RCLK, and the second discharger 522 may discharges an output terminal, through which the second output signal OUT2 may be output, in response to the falling clock signal FCL. The chargers PM1 and PM2 may respectively charge a first capacitor C1 and a second capacitor C2 in response to the strobe signal STB. The equalizers PM3 and PM4 may equalize the output terminals of the first output signal OUT1 and the second output signal OUT2 to the same voltage level in response to the strobe signal STB. The enabler NM1 may control an enablement of the duty rate discharge unit 520 in response to the strobe signal STB. Herein, the duty rate discharge unit 520 may decide when the charge operation and the discharge operation may begin in response to the strobe signal STB.

The output unit 530 may output the duty rate detection signal DET in response to the time control signal CTR_T based on the first output signal OUT1 and the second output signal OUT2 of the duty rate discharge unit 520. The output unit 530 may be formed of an SR latch circuit. The SR latch circuit may generate an output signal of a logic high level or a logic low level according to the first output signal OUT1 and the second output signal OUT2.

Figure 6:
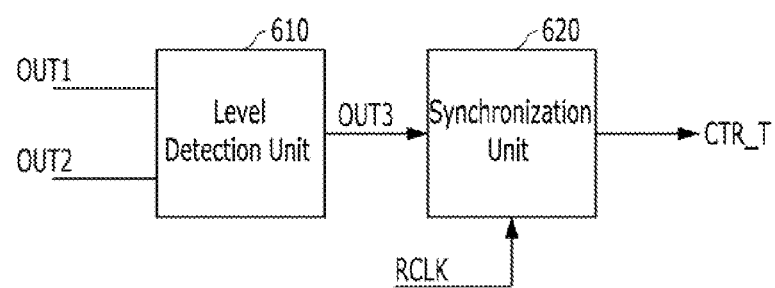
FIG. 6 is a block diagram illustrating an output control block of the duty rate detection circuit shown in FIG. 4.

FIG. 6 is a block diagram illustrating an output control block of the duty rate detection circuit shown in FIG. 4.

Referring to FIG. 6, the output control block 420 may include a level detection unit 610 and a synchronization unit 620.

The level detection unit 610 may detect the first output signal OUT1 and the second output signal OUT2 discharged to a predetermined target voltage level. Discharge lowers the voltage levels of the first output signal OUT1 and the second output signal OUT2. When any one of the first output signal OUT1 and the second output signal OUT2 is discharged to the predetermined target voltage level, the level detection unit 610 detects it and outputs a third output signal OUT3. Since the level detection unit 610 may detect any one output signal that is discharged first between the first output signal OUT1 and the second output signal OUT2, the level detection unit 610 may be formed of an SR latch or an OR gate.

The synchronization unit 620 may synchronize the output signal OUT3 of the level detection unit 610 with the rising clock signal RCLK and may output the time control signal CTR_T. The synchronization unit 620 may be formed of a flip-flop circuit. The output unit 530 shown in FIG. 5 operating in response to the time control signal CTR_T synchronized with the rising clock signal RCLK may generate the duty rate detection signal DET where the failing clock signal FOLK is reflected. This will be described again later.

Figure 7:
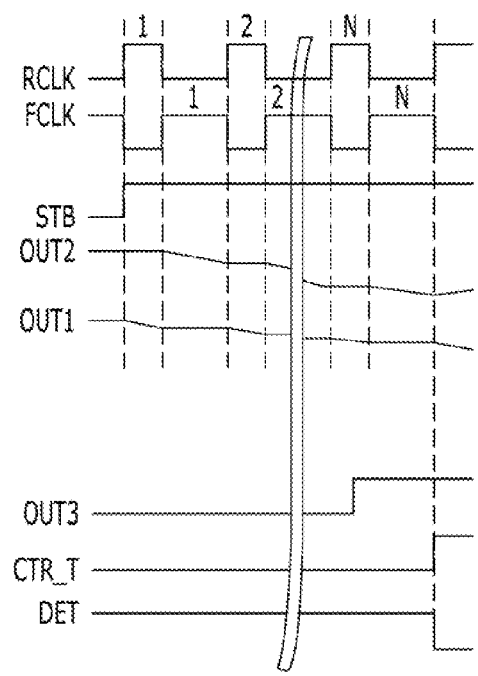
FIG. 7 is a timing diagram illustrating operations of the duty rate detection circuit, the duty rate detection circuit and the output control block shown in FIGS. 4 to 6.

FIG. 7 is a timing diagram illustrating operations of the duty rate detection circuit, the duty rate detection circuit and the output control block shown in FIGS. 4 to 6.

Referring to FIGS. 4 to 7, the first output signal OUT1 and the second output signal OUT2 may be pre-charged during the strobe signal STB has a logic low level. The strobe signal generation unit 510 may disable the strobe signal STB to a logic high level in synchronization with the rising clock signal RCLK. As a result, the duty rate discharge unit 520 may discharge the first output signal OUT1 and the second output signal OUT2 in response to the rising clock signal RCLK and the falling clock signal FCLK. The level detection unit 610 shown in FIG. 6 may detect the first output signal OUT1 and the second output signal OUT2 discharged to the predetermined level. The level detection unit 610 may enable the third output signal OUT3 for example, at an $N^{th}$ rising clock signal RCLK. The synchronization unit 620 shown in FIG. 6 may generate the time control signal CTR_T by synchronizing the third output signal OUT3 with the rising clock signal RCLK, and the output unit 530 shown in FIG. 5 may generate the duty rate detection signal DET based on the first output signal OUT1 where the $N^{th}$ rising clock signal RCLK is reflected and the second output signal OUT2 where an $N^{th}$ falling clock signal FCLK is reflected in response to the time control signal CTR_T. As shown in the drawing, the discharges of the first output signal OUT1 and the second output signal OUT2 during both of the first to $N^{th}$ rising clock signals RCLK and the first to $N^{th}$ falling clock signals FCLK are reflected in the duty rate detection signal DET.

Since the duty rate detection circuit in accordance with the embodiment of the present invention may make the number of pulses of the rising clock signal RCLK and the number of pulses of the falling dock signal FCLK that represent time periods of discharges of the first output signal OUT1 and the second output signal OUT2 to be the same, it is possible to accurately detect the duty rate of the rising clock signal RCLK and the falling clock signal FCLK.

Figure 8:
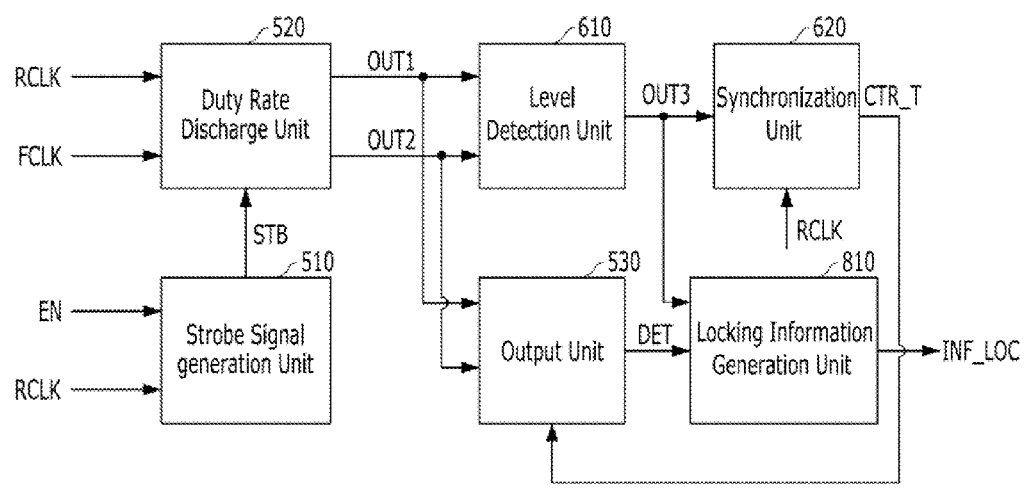
FIG. 8 is a block diagram illustrating a semiconductor device having the duty rate detection circuit shown in FIGS. 5 and 6.

FIG. 8 is a block diagram illustrating a semiconductor device having the duty rate detection circuit shown in FIGS. 5 and 6.

Referring to FIG. 8, the semiconductor device may include the strobe signal generation unit 510, the duty rate discharge unit 520, the output unit 530, the level detection unit 610, the synchronization unit 620 and a locking information generation unit 810. The locking information generation unit 810 may compare the third output signal OUT3 of the level detection unit 610 with the duty rate detection signal DET of the output unit 530 and may generate duty locking information INF_LOC. The duty locking information INF_LOC may indicate the duty rate of approximately 50:50 of the clock signal, which means that the logic high duration of the rising clock signal RCLK and the logic high duration of the falling clock signal FCLK are almost the same.

Figure 9A:
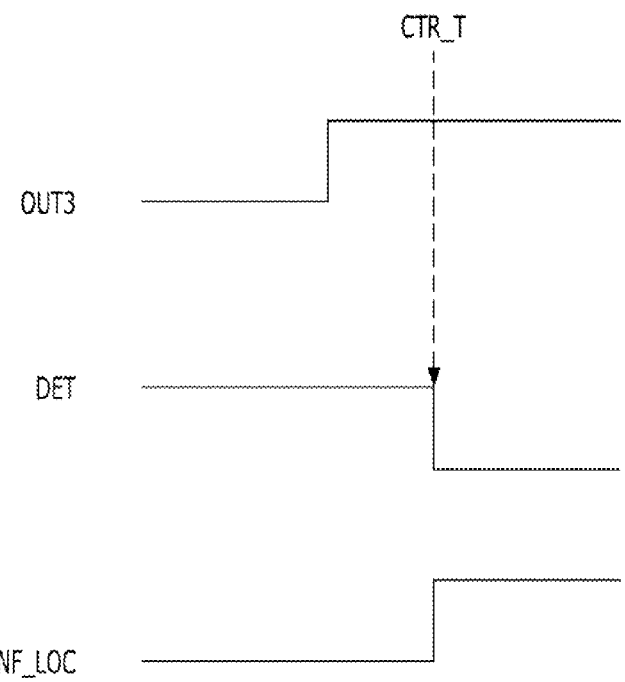
FIGS. 9A to 9B are timing diagrams illustrating duty locking information of the semiconductor device shown in FIG. 8.
Figure 9B:
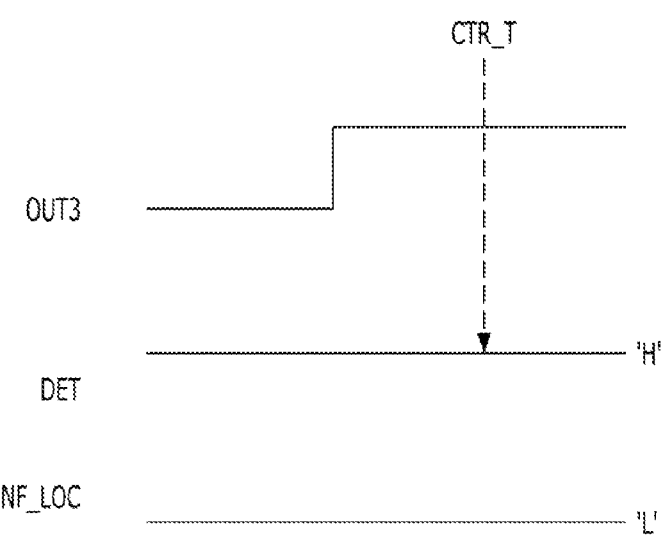

FIGS. 9A to 9B are timing diagrams illustrating duty locking information of the semiconductor device shown in FIG. 8. For clear description, it is assumed that the third output signal OUT3 has a logic high level when the logic high duration of the rising clock signal RCLK is longer than the logic high duration of the falling dock signal FCLK. It is also assumed that the duty rate detection signal DET has a logic low level when the logic high duration of the falling clock signal FCLK is longer than the logic high duration of the rising clock signal RCLK; and the duty rate detection signal DET has a logic high level when the logic high duration of the rising clock signal RCLK is longer than the logic high duration of the falling clock signal FCLK.

Referring to FIG. 9A, the third output signal OUT3 of the logic high level indicates that the logic high duration of the rising clock signal RCLK is longer than the logic high duration of the falling clock signal FCLK. However, the duty rate detection signal DET of logic low level at the enablement of the time control signal CTR_T indicates that the logic high duration of the falling clock signal FCLK is longer than the logic high duration of the rising clock signal RCLK. This means that the logic high duration of the rising clock signal RCLK and the logic high duration of the falling clock signal FCLK are almost the same. Accordingly, the duty locking information INF_LOC is enabled to a logic high level.

Referring to FIG. 9B, the third output signal OUT3 of the logic high level indicates that the logic high duration of the rising clock signal RCLK is longer than the logic high duration of the falling clock signal FCLK. Also, the duty rate detection signal DET of logic high level at the enablement of the time control signal CTR_T indicates that the logic high duration of the rising clock signal RCLK is longer than the logic high duration of the falling clock signal FCLK. This means that the logic high duration of the rising clock signal RCLK is still longer than the logic high duration of the falling clock signal FCLK. Accordingly, the duty rate of the clock signal has to be controlled continuously. The duty locking information INF_LOC is in a logic low level.

The semiconductor device in accordance with the embodiment of the present invention may generate the duty locking information INF_LOC based on an accurate detection signal with the same number of discharges in the logic high duration and logic low duration of a clock signal. For example, a circuit such as a locked loop may receive the duty locking information INF_LOC and be secured with a stable circuit operation.

As described above, the duty rate detection circuit in accordance with the embodiment of the present invention may detect more accurate duty rate and may generate duty locking information.

According to an embodiment of the present invention, the duty rate of a clock signal is accurately detected and a circuit in need of an accurate duty rate may be provided with a highly reliably detection result.

While the present invention has been described with respect to the specific embodiments, it will be apparent to those skilled in the art that various changes and modifications may be made without departing from the spirit and scope of the invention as defined in the following claims.

Moreover, the logic gates and transistors illustrated in the above embodiments of the present invention may be realized to have their positions and kinds differently according to the polarity of an input signal.

What is claimed is:

1. A duty rate detection circuit comprising:
   a duty rate detection block suitable for outputting a duty rate detection signal by detecting a duty rate of a clock signal having a first logic duration and a second logic duration; and
   an output control block suitable for comparing the number of the first logic duration and the number of the second logic duration for a detection period and controlling an output moment of the duty rate detection signal,
   wherein the duty rate detection block includes a duty rate discharge unit for performing a discharge operation during each of the first logic duration and the second logic duration and is designed as a current mirror type.

2. The duty rate detection circuit of claim 1, wherein the duty rate detection block further includes:
   an output unit for outputting the duty rate detection signal based on an output signal of the duty rate discharge unit output at an end of the detection period.

3. The duty rate detection circuit of claim 2, wherein the duty rate discharge unit includes:
   a first discharger for discharging a first output terminal during the first logic duration;
   a second discharger for discharging a second output terminal during the second logic duration; and
   a charger for charging the first output terminal and the second output terminal in response to a strobe signal.

4. The duty rate detection circuit of claim 3, wherein the duty rate detection block further includes a strobe signal generation unit for generating the strobe signal in synchronization with the first logic duration.

5. The duty rate detection circuit of claim 4, wherein the output control block includes:
   a level detection unit for detecting voltage levels of the first output terminal and the second output terminal discharged to a predetermined target voltage level; and a synchronization unit for synchronizing an output signal of the level detection unit to the first logic duration and generating a time control signal defining the detection period.

6. A semiconductor device comprising:
a duty rate discharge unit suitable for performing a discharge operation in a first output terminal and a second output terminal during a first logic duration and a second logic duration of a clock signal, respectively;
a level detection unit suitable for detecting voltage levels of the first output terminal and the second output terminal discharged to a predetermined target voltage level;
an output unit suitable for detecting a duty rate of the clock signal at a moment when the number of the first logic duration and the number of the second logic duration representing the discharge operation time become the same after an output signal of the level detection unit is enabled; and
a locking information generation unit suitable for generating duty locking information by comparing the output signal of the level detection unit with an output signal of the output unit.

7. The semiconductor device of claim 6, wherein the duty locking information is enabled when the output signal of the level detection unit and the output signal of the output unit represent different logic durations of first logic duration and the second logic duration of the clock signal.

8. The semiconductor device of claim 6, wherein the duty rate discharge unit includes:
a first discharger for discharging the first output terminal during the first logic duration;
a second discharger for discharging the second output terminal during the second logic duration; and
a charger for charging the first output terminal and the second output terminal in response to a strobe signal.

9. The semiconductor device of claim 8, further comprising a strobe signal generation unit suitable for generating the strobe signal in synchronization with the first logic duration.

10. The semiconductor device of claim 8, further comprising a synchronization unit suitable for synchronizing an output signal of the level detection unit to the first logic duration and generating a time control signal defining the moment when the number of the first logic duration and the number of the second logic duration representing the discharge operation time become the same after an output signal of the level detection unit is enabled.

11. The semiconductor device of claim 6, wherein the duty rate discharge unit is designed as a current mirror type.

12. A duty rate detection circuit comprising:
a duty rate discharge unit suitable for respectively discharging a first terminal therein and a second terminal therein having corresponding predetermined voltage levels for corresponding duration between a first logic duration and a second logic duration of a clock signal;
an output control unit suitable for generating a discharge detection signal synchronized with the first logic duration when one of the first terminal and the second terminal is discharged to a reference voltage level; and
an output unit suitable for detecting in response to the discharge detection signal synchronized with the first logic duration a duty rate of the clock signal based on the clock signal having toggled until the discharge detection signal is synchronized with the first logic duration,
wherein, the duty rate discharge unit begin discharging in synchronized with the first logic duration.

13. The duty rate detection circuit of claim 12, wherein the duty rate discharge unit includes:
a charger for charging the first terminal and the second terminal to the corresponding predetermined voltage levels;
a first discharger for discharging the first terminal during the first logic duration; and
a second discharger for discharging the second terminal during the second logic duration.

14. The duty rate detection circuit of claim 12, wherein the output control block includes:
a level detection unit for generating the discharge detection signal when one of the first terminal and the second terminal is discharged to a reference voltage level; and
a synchronization unit for synchronizing the discharge detection signal to the first logic duration.

* * * * *